(12) United States Patent
Ovadia

(10) Patent No.: US 10,698,805 B1
(45) Date of Patent: *Jun. 30, 2020

(54) METHOD AND SYSTEM FOR PROFILING PERFORMANCE OF A SYSTEM ON CHIP

(71) Applicant: Cadence Design Systems, Inc., San Jose, CA (US)

(72) Inventor: Meir Ovadia, Rosh Ha-Ayin (IL)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/414,776

(22) Filed: Jan. 25, 2017

(51) Int. Cl.
*G06F 17/50* (2006.01)
*G06F 11/30* (2006.01)
(Continued)

(52) U.S. Cl.
CPC ...... *G06F 11/3688* (2013.01); *G06F 11/3604* (2013.01); *G06F 11/3636* (2013.01);
(Continued)

(58) Field of Classification Search
CPC .. G06F 17/5022; G06F 17/5036; G06F 17/50; G06F 17/5045; G06F 11/273; G06F 11/0769; G06F 11/2733; G06F 11/323; G06F 11/3636; G06F 11/3644; G06F 11/3664; G06F 11/362; G06F 11/261; G06F 11/36; G06F 17/5031; G06F 17/505;
(Continued)

(56) References Cited

U.S. PATENT DOCUMENTS

| | | | | | |
|---|---|---|---|---|---|
| 5,325,309 A | * | 6/1994 | Halaviati | ............. | G01R 31/305 703/15 |
| 5,371,851 A | * | 12/1994 | Pieper | ............ | G01R 31/318307 345/501 |

(Continued)

OTHER PUBLICATIONS

Meiyappan Nagappan et al., Creating operational profiles of software systems by transforming their log files to directed cyclic graphs, May 23, 2011, [Retrieved on Dec. 20, 2019]. Retrieved from the internet: <URL: https://dl.acm.org/citation.cfm?id=1987869> 4 Pages (54-57) (Year: 2011).*

(Continued)

*Primary Examiner* — Anibal Rivera
(74) *Attorney, Agent, or Firm* — Pearl Cohen Zedek Latzer Baratz LLP

(57) ABSTRACT

A method for debugging a system on chip (SoC) under test, may include automatically inserting commands in a test code for testing the SoC for invoking printing of messages of data, each message of the messages including start time, end time of each executed action of a plurality of actions, the executed action to be invoked by the test code when testing the SoC, the data further including identity of a processing component of a plurality of processing components of the SoC, on which the executed action was executed; recording the data of the invoked printed messages during testing of the test code on the SoC; and displaying, via a graphical user interface, one or a plurality of graphical representations, each of said graphical representations relating to a period of activity of one of the plurality of processing components over time, based on the recorded data.

15 Claims, 11 Drawing Sheets

(51) Int. Cl.
*G06F 9/44* (2018.01)
*G06F 11/36* (2006.01)
G06F 11/07 (2006.01)
G06F 11/273 (2006.01)

(52) U.S. Cl.
CPC ........ *G06F 11/0769* (2013.01); *G06F 11/273* (2013.01); *G06F 17/5022* (2013.01)

(58) Field of Classification Search
CPC ............. G06F 17/5081; G06F 11/3457; G06F 11/2242; G06F 11/221
See application file for complete search history.

(56) References Cited

U.S. PATENT DOCUMENTS

| | | | | |
|---|---|---|---|---|
| 5,920,490 A * | 7/1999 | Peters | ............ | G01R 31/318342 714/744 |
| 5,940,604 A * | 8/1999 | Merryman | .......... | G06F 17/5045 716/132 |
| 5,960,171 A * | 9/1999 | Rotman | .............. | G06F 17/5022 714/33 |
| 5,991,533 A * | 11/1999 | Sano | .................... | G06F 17/5022 703/22 |
| 6,163,763 A * | 12/2000 | Cox | .................... | G06F 11/0769 703/14 |
| 6,230,114 B1 * | 5/2001 | Hellestrand | ........... | G06F 11/261 703/13 |
| 6,263,301 B1 * | 7/2001 | Cox | .................... | G06F 17/5022 702/67 |
| 6,263,302 B1 * | 7/2001 | Hellestrand | ........... | G06F 11/261 703/17 |
| 6,336,199 B1 * | 1/2002 | Lin | ..................... | G06F 17/5022 714/742 |
| 6,457,152 B1 * | 9/2002 | Paley | ...................... | H04L 29/06 714/33 |
| 6,539,522 B1 * | 3/2003 | Devins | ........... | G01R 31/318357 716/106 |
| 6,571,373 B1 * | 5/2003 | Devins | ........... | G01R 31/318357 716/103 |
| 6,751,565 B2 | 6/2004 | Naroska et al. | | |
| 6,789,242 B1 * | 9/2004 | Liu | ..................... | G06F 17/5022 703/19 |
| 6,829,751 B1 | 12/2004 | Shen et al. | | |
| 6,845,341 B2 * | 1/2005 | Beverly | ............... | G06F 17/5022 702/182 |
| 7,080,283 B1 * | 7/2006 | Songer | ................ | G06F 11/3636 714/30 |
| 7,185,295 B2 | 2/2007 | Park et al. | | |
| 7,437,692 B2 | 10/2008 | Oberlaender | | |
| 7,451,070 B2 * | 11/2008 | Devins | ..................... | G06F 17/5022 703/13 |
| 7,500,046 B1 * | 3/2009 | Puri | ....................... | G06F 11/277 710/305 |
| 7,571,400 B2 | 8/2009 | Park et al. | | |
| 7,823,017 B2 * | 10/2010 | Bueti | .................. | G06F 17/5022 714/30 |
| 8,073,820 B2 | 12/2011 | Srinivasan et al. | | |
| 8,176,296 B2 * | 5/2012 | Snyder | ...................... | G06F 1/08 712/32 |
| 8,560,893 B1 * | 10/2013 | Hollander | ............... | G06F 11/00 714/47.1 |
| 8,639,487 B1 * | 1/2014 | Ezer | ...................... | G06F 17/505 703/13 |
| 8,732,632 B1 * | 5/2014 | Keller | ............... | G01R 31/31855 716/101 |
| 8,781,808 B2 | 7/2014 | Yang | | |
| 8,832,615 B2 | 9/2014 | Hsieh et al. | | |
| 8,869,093 B2 | 10/2014 | Elliott | | |
| 8,881,114 B2 * | 11/2014 | Sohm | ..................... | G06F 11/3471 717/128 |
| 9,081,824 B2 | 7/2015 | Becker et al. | | |
| 9,081,924 B2 | 7/2015 | Chen et al. | | |
| 9,280,627 B1 * | 3/2016 | Zhang | ................. | G06F 17/5022 |
| 9,286,180 B1 * | 3/2016 | Musunuri | ............ | G06F 11/263 |
| 9,304,880 B2 * | 4/2016 | Olivarez | ............ | G06F 11/2242 |
| 9,316,689 B2 * | 4/2016 | Hamid | .................. | G06T 11/206 |
| 9,582,406 B1 | 2/2017 | Teplitsky et al. | | |
| 9,606,888 B1 * | 3/2017 | Wiesner | ............. | G06F 11/3664 |
| 9,734,263 B2 * | 8/2017 | Kohavi | ............. | G06F 17/5081 |
| 10,042,729 B2 * | 8/2018 | Pappu | ................ | G01R 31/31915 |
| 2002/0147560 A1 * | 10/2002 | Devins | ........... | G01R 31/318357 702/118 |
| 2003/0056163 A1 * | 3/2003 | Rajsuman | ............ | G01R 31/317 714/724 |
| 2003/0154063 A1 | 8/2003 | Lu et al. | | |
| 2004/0010401 A1 * | 1/2004 | Davis | .................. | G06F 17/5022 703/14 |
| 2004/0017219 A1 * | 1/2004 | Han | .................. | G01R 31/31705 326/16 |
| 2005/0102572 A1 * | 5/2005 | Oberlaender | ........ | G06F 17/5022 714/29 |
| 2006/0190871 A1 * | 8/2006 | Likovich, Jr. | .. | G01R 31/318314 716/104 |
| 2006/0229858 A1 * | 10/2006 | Devins | ................ | G06F 17/5022 703/14 |
| 2006/0259823 A1 * | 11/2006 | Sohm | .................. | G06F 11/3636 714/38.13 |
| 2006/0259824 A1 * | 11/2006 | Sohm | ................ | G06F 11/323 714/38.13 |
| 2006/0259827 A1 * | 11/2006 | Sohm | ................ | G06F 11/3644 714/38.1 |
| 2006/0259831 A1 * | 11/2006 | Sohm | ................ | G06F 11/3471 714/45 |
| 2007/0006173 A1 * | 1/2007 | Sohm | ................ | G06F 11/3636 717/131 |
| 2007/0011527 A1 * | 1/2007 | Goswami | ....... | G01R 31/318547 714/726 |
| 2007/0033552 A1 | 2/2007 | Li | | |
| 2007/0260952 A1 * | 11/2007 | Devanathan | ... | G01R 31/318575 714/726 |
| 2008/0034334 A1 * | 2/2008 | Laouamri | ...... | G01R 31/318505 716/136 |
| 2008/0127216 A1 * | 5/2008 | Bueti | .................. | G06F 15/7842 719/318 |
| 2008/0147372 A1 | 6/2008 | Paulsen | | |
| 2008/0183457 A1 * | 7/2008 | Klein | ................ | G06F 11/3664 703/14 |
| 2008/0184150 A1 | 7/2008 | Minato et al. | | |
| 2008/0215923 A1 * | 9/2008 | Bueti | ................ | G06F 17/5022 714/39 |
| 2010/0023807 A1 * | 1/2010 | Wu | ...................... | G06F 11/2236 714/30 |
| 2010/0031209 A1 * | 2/2010 | Luan | .................... | G06F 17/5031 716/113 |
| 2010/0095255 A1 | 4/2010 | Thompson et al. | | |
| 2010/0223035 A1 * | 9/2010 | Weyh | ................. | G01R 31/2846 703/2 |
| 2011/0087813 A1 * | 4/2011 | Clark | ................ | G06F 13/4256 710/105 |
| 2011/0238397 A1 * | 9/2011 | Chen | .................. | G06F 11/3672 703/13 |
| 2011/0283247 A1 * | 11/2011 | Ho | ........................ | G06F 11/362 716/107 |
| 2011/0289373 A1 | 11/2011 | Klein et al. | | |
| 2012/0072199 A1 * | 3/2012 | Kawahara | ............ | G06F 11/3457 703/21 |
| 2012/0159251 A1 * | 6/2012 | Wu | ...................... | G06F 11/2236 714/30 |
| 2013/0041645 A1 * | 2/2013 | Kawata | .............. | G06F 17/5036 703/14 |
| 2014/0157073 A1 * | 6/2014 | Douskey | ........... | G01R 31/3177 714/732 |
| 2014/0181767 A1 * | 6/2014 | Kohavi | ................ | G06F 17/5081 716/106 |
| 2014/0201584 A1 * | 7/2014 | Tekumalla | ..... | G01R 31/318536 714/727 |
| 2014/0237292 A1 * | 8/2014 | Chan | .................. | G06F 11/2733 714/32 |

(56) References Cited

U.S. PATENT DOCUMENTS

| | | | | |
|---|---|---|---|---|
| 2014/0281735 A1* | 9/2014 | Olivarez | ............. | G06F 11/2242 714/40 |
| 2015/0178138 A1* | 6/2015 | Saha | ..................... | G06F 9/5094 718/104 |
| 2015/0301108 A1* | 10/2015 | Hamid | .................. | G06F 3/0484 714/724 |
| 2015/0331043 A1* | 11/2015 | Sastry | ..................... | G06F 21/31 714/727 |
| 2016/0054388 A1* | 2/2016 | Tamiya | .................. | G06F 11/36 714/736 |
| 2016/0070846 A1* | 3/2016 | Nandini | ............. | G06F 17/5081 716/106 |
| 2016/0084906 A1* | 3/2016 | Tamiya | ............ | G01R 31/31705 714/735 |
| 2016/0098332 A1* | 4/2016 | Liu | ....................... | G06F 11/221 714/30 |
| 2016/0232264 A1* | 8/2016 | Oh | ..................... | G06F 17/5045 |
| 2016/0282413 A1* | 9/2016 | Tamiya | ............ | G01R 31/31705 |
| 2016/0364308 A1* | 12/2016 | Shanbhogue | ....... | G06F 11/2635 |
| 2017/0082687 A1* | 3/2017 | Klinger | ................. | G06F 11/273 |
| 2017/0139007 A1* | 5/2017 | Mueller-Schniek | ........................ | G01R 31/318508 |
| 2017/0184662 A1* | 6/2017 | Varadarajan | ........... | G11C 29/44 |
| 2017/0227603 A1* | 8/2017 | Hamid | .................... | G06F 11/25 |
| 2017/0286247 A1* | 10/2017 | Pappu | .............. | G01R 31/31915 |

OTHER PUBLICATIONS

Vitaly Zakharenko et al., Characterizing the performance benefits of fused CPU/GPU systems using FusionSim, Mar. 18-22, 2013, [Retrieved on Dec. 20, 2019]. Retrieved from the internet: <URL: https://dl.acm.org/citation.cfm?id=2485455> 4 Pages (685-688) (Year: 2013).*

Non-final office action of U.S. Appl. No. 14/755,071, dated Mar. 24, 2017.

Notice of Allowance of U.S. Appl. No. 14/755,071, dated Jul. 25, 2017.

* cited by examiner

FIG. 2

IDA – Incisive Debug Analyzer

| SmartLog | | | Graphs | | Files... | svr_debug_util.sin | svr_soc_test.c |
|---|---|---|---|---|---|---|---|

Simulation Time (fs)

```
F  535,720,000 ... SVR: (201) usb_c::write [527]
F  535,721,000 ... SVR: (202) usb_c::write [527]
F  535,721,000 ... SVR: (203) usb_c::write [527]
F  535,722,000 ... SVR: (220) audio_c::play [42]
F  535,722,000 ... SVR: (221) audio_c::play [42]
F  535,723,000 ... SVR: (222) audio_c::play [42]
F  535,723,000 ... SVR: (223) audio_c::play [42]
F  535,724,000 ... SVR: (264) usb_c::write [143]
F  535,725,000 ... SVR: (265) usb_c::write [143]
F  535,726,000 ... SVR: (266) usb_c::write [143]
F  535,727,000 ... SVR: (267) usb_c::write [143]
F  535,728,000 ... SVR: (208) display_c::show[...
F  535,728,000 ... SVR: (209) display_c::show[...
F  535,729,000 ... SVR: (210) display_c::show[...
F  535,729,000 ... SVR: (211) display_c::show[...
M  545,253,000 ... SVR: (42) i22:capture [460]@...
L  545,258,000 ... SVR: (43) modem_c::transmit...
M  545,265,000 ... SVR: (44) a0:transmit [464]@...
N  545,266,000 ... SVR: (45) a0:transmit [464]@...
M  551,380,000 ... SVR: (46) a0:transmit [464]@...
F  551,383,000 ... SVR: (352) modem_c::transmit
F  551,385,000 ... SVR: (353) modem_c::transmit
F  551,386,000 ... SVR: (354) modem_c::transmit
F  551,388,000 ... SVR: (264) usb_c::write [143]
F  551,427,000 ... SVR: (265) usb_c::write [143]
F  551,428,000 ... SVR: (266) usb_c::write [143]
F  551,429,000 ... SVR: (267) usb_c::write [143]
```

Graphs column:
- 110
- 105 → i22: capture[460]  c camera_c  DVE.camera  o proc_tag  proc3
- 104 → 112 → a0: transmit[464]  c modem_c  DVE.modem  o proc_tag  proc_gpx
- 113 → 102

Files / Code column (202):

```
/* code for i22:capture 460 declared at line 188 in yamm_base */
svr_fast_message0_3(40); /*Start action msg */
/* #message(NONE,"Executing: camera_c:capture"), at line 136 in @yamm_host_execs*/
svr_fast_message0_3(41);
yamm_rand_delay();
/* processor proc 3 sending a 'sync action' message to processor proc_gpx*/
slnp_mbox_send_int_mem(3, 13, 17, 0);
svr_fast_message0_3(42);/* End action msg */          206
svr_fast_message0_3(43);/* End scenario msg */
return SLN_TRUE;
}
/* Code for scenario: transmit id: 467 processor: proc_gpx */
static svr_scenario_t*S = 0x0;
S = svr_transmit_scenario_init_467_6(nested_info);
SLN_BOOL svr_transmit_scenario_start_467_6(svr_nested_scenario_t* nested_info)
/* processor proc_gpx waiting for a 'sync action' message from processor proc 3 */
while (1) {slnp_mbox_harvest_mem(6, 13); if (sln_read_int_mail(17, 0x0) > 0) break; SLNP_Y
/* Code for a0:transmit 464 declared at line 166 in yamm_base */
svr_fast_message0_6(44);/* Start action msg */        204
/* #message(NONE,"Executing: modem_c::transmit"), at line 60 in @yamm_host_execs*/
svr_fast_message0_6(45);
yamm_rand_delay();
svr_fast_message0_6(46);/* End action msg */
return SLN_TRUE;
}
/* Code for scenario: play id: 421 processor: proc_gpx*/
static svr_scenario_t*S = 0x0;
S = svr_play_scenario_init_421_6(nested_info);
svr_fast_message0_6(47);/* Start scenario msg */
SLN_BOOL svr_play_scenario_start_421_6(sv_nested_scenario_t*nested_info)
/* Code for i20: receive 414 declared at line 161 in yamm_base */
                                                       200
```

METHOD AND SYSTEM FOR PROFILING PERFORMANCE OF A SYSTEM ON CHIP

FIELD OF THE INVENTION

The present disclosure relates to design verification. More specifically, the present invention relates to method and system for profiling performance of a System on Chip.

BACKGROUND OF THE INVENTION

Given the typical design complexity of today's advanced systems on chip (SoCs), many engineers validate their SoCs using production software stacks and/or employing basic directed bare-metal software tests. Such efforts, which can be time consuming and/or labor-intensive, often come up short in, for example, coverage of use cases.

SUMMARY OF THE INVENTION

There is provided, in accordance with some embodiments of the present invention, a method for debugging a system on chip (SoC) under test. The method may include automatically inserting commands in a test code for testing the SoC for invoking printing of messages of data including start time, end time of each executed action of a plurality of actions designed to be invoked by the test code when testing the SoC, the data further including identity of a processing component of a plurality of processing components of the SoC, on which that action was executed. The method may also include recording the data of the invoked printed messages during testing of the test code on the SoC. The method may further include displaying, via a graphical user interface, one or a plurality of graphical representations, each of said graphical representations relating to a period of activity of one of the plurality of processing components over time, based on the recorded data.

In some embodiments, the method may further include automatically generating the test code.

In some embodiments, the method may further include receiving from a user a selection of a graphical representation of said one or a plurality of graphical presentations, and displaying via the graphical user all actions of said plurality of actions that were performed during the period of activity of the one processing component.

In some embodiments, said all actions may be displayed using representations of time slots, each of the time slots representing a time duration during which each of said all actions was performed.

In some embodiments the time slots are represented by sub-blocks.

In some embodiments the method may further include receiving from the user a selection of an action of said all actions, and displaying via the graphical user interface only that action.

According to some embodiments, that action is displayed using one or more representations of time slots, each of the time slots representing a time duration during which that action was performed.

A system and computer readable medium are also described herein.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates a screen of a graphical user interface (GUI) of a SoC system verifier, in accordance with some embodiments of the present invention.

FIG. 3 illustrates a screen of a graphical user interface (GUI) of a SoC system verifier, in accordance with some embodiments of the present invention.

FIG. 4 illustrates a screen of a graphical user interface (GUI) of a SoC system verifier, in accordance with some embodiments of the present invention.

DETAILED DESCRIPTION OF THE PRESENT INVENTION

Figure 1:
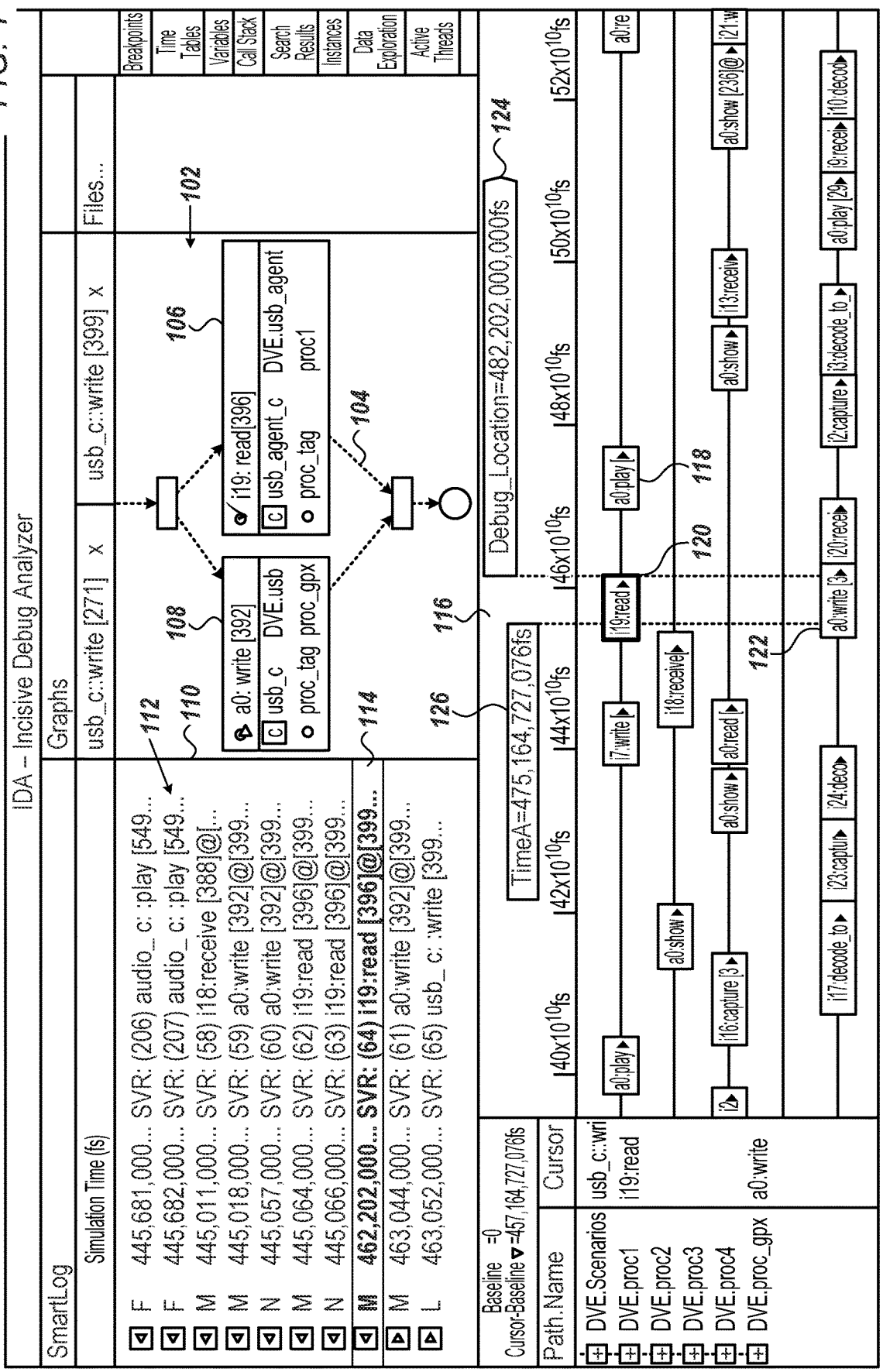
FIG. 1 illustrates a screen depicting a graphical user interface (GUI) of a SoC system verifier, in accordance with some embodiments of the present invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as is apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

A system on chip (SoC) can be an integrated circuit that integrates components of a computer or an electronic system into a single chip. In the development process of SoCs, electronic design automation (EDA) tools, e.g., software tools, can be used to design, and/or test (simulate and/or validate) each of the components verification separately, the entire SoC as a whole, or any combination thereof.

One approach to testing of a system on a chip (SoC) can be to exercise the system-level use-cases via the programmer-view using software (SW) driven tests (sometimes referred to as "scenarios"). These tests can be manually written (e.g., in C), e targeting bare-metal hardware without an operating system (OS) and/or on top of some form of production software stack (SS), and/or can require fast platforms such as Field Programmable Gate Array (FPGA) prototyping, emulation, and/or an actual silicon device for the testing.

Tests can be designed to exercise a SoC by, for example, causing the SoC to perform various actions it can be designed to perform. Typically, various components of a SoC may perform a large number of actions, which may only be performed in a permissible order (or "flow").

Some actions may be performed separately (e.g., turning the power on), some may be performed concurrently with other actions (e.g., displaying video on a screen and playing audio on a loudspeaker). Some actions may only be performed after one or a plurality of other (or same) actions were previously performed and completed (e.g., microphone is turned on only after "record" is pressed). Some actions cannot be performed after one or a plurality of other (or same) actions were previously performed and completed (e.g., the power of the SoC was turned off). The testing expert can write a series of scenarios that can each including a combination of actions that the SoC is capable of performing, in, for example, a permissible order. "Permissible order" can be, for example, possible orders of actions that may be performed by the SoC, and/or that can comply with the constraints governing the operation of the SoC and in particular the performance of actions by the SoC (order of actions, data-flow, etc.).

The tedious manual approach, the quest for quality test content, and/or the lack of a coverage driven flow can be concerns for advanced multi-core SoC providers.

At the sub-system and system integration levels, hardware (HW) verification engineers may deal with more hardware and software interdependencies and may need to adjust as well. In many instances, they may wish to explore a subset of SoC use-cases that can be executed on register transfer level (RTL) simulation and acceleration platforms. A coverage driven random approach that may be useful for IP level may not serve the system-level use-cases well because it typically focuses on verifying all possible combinations, and makes the high-level directed test logic coding error prone.

Furthermore, the cost of transferring use-cases across teams and platforms (from virtual to RTL simulation to acceleration/emulation to FPGA prototype to post-silicon, etc.) is becoming untenable for chip-makers, thereby creating a commercial demand for a solution that allows complex use-case creation and reuse across teams, and that allows for the tests to be executed on all platforms. Portability across platforms not only may improve quality, and may save development time, it may also allow more efficient debugging by offering the flexibility to move a failing test found running on a fast platform with limited visibility to a different platform with more visibility.

The term 'system-level use-cases' may be taken, in the context of the present specification in a broad sense to include application-like flows and datapaths, stress tests of interconnect fabrics and memories, and exercising system-level protocols such as cache and input-output (IO) coherency, security, memory virtualization and low-power management. Although very different in nature, there is in fact commonality in the implementation of these.

Consider the following test implementation challenges:

A) Coming up with consistent configuration of multiple IPs and resource allocation: legal pad settings, DMA channel allocations, interrupt lines, video pipes, etc.

B) Scheduling and synchronizing concurrent activity: (a) on multiple HW devices using a single embedded core; (b) across multiple embedded cores; (c) between embedded cores, testbench transactors, and host executed logic.

C) Handling crosscutting activity on the very same cores, such as power-down or reset events during memory or cache data flow operations.

D) Covering complex state-spaces like coherency protocol state-machine or multi-domain low-power specifications.

E) Creating and coordinating multiple test artifacts (other than the embedded code) such as bus functional model (BFM) commands, expected data files, and compilation/run script.

Most if not all of the abovementioned challenges may come into play in the implementation of different kinds of system use-cases. On top of these, test implementation may be aimed at addressing other concerns, such as multiple platforms, adequate checking strategy, debug, maintenance, and functional coverage for completion measurement.

In terms of test creation, users may write a single-thread program, and even come-up with a Perl-like automation around it. Talented programmers may even write use-cases involving two or more cores, while carefully orchestrating system states, synchronization points, and latencies throughout the execution. But this is not scalable. It does not scale with complexity of the required scenarios, being longer, and involving more cores, more sophisticated IPs, more power domains. It does not scale to the amount of different parameter variations that need to be tested for each use-case. And it cannot be maintained and adapted through the changes of underlying designs and SW APIs, as well as the differences in execution platforms.

To fully address SoC-level verification, a solution may be characterized as allowing not only for vertical (IP to SoC) reuse and horizontal (cross-platform) reuse, but also for providing a way to capture and share use-cases. Reuse should preferably work both ways, as sub-system teams wish to leverage the full system context and use-cases and wish become more productive in their testing.

A system and method for system verification (hereinafter also referred to as "system verifier") was introduced that is a use-case based verification tool tailored for software driven verification automation. The system verifier may offer a model-based approach to describe system level actions and resources that can be composed into subsystem and system level abstract use-cases. The system verifier can automatically generate SoC verification tests, rather than depend on a human testing expert to write up these tests.

The automatic generation of SoC verification tests may include receiving from a user (e.g., a testing expert) a list of all actions the SoC to be tested may perform and constraints relating to the permissible order of these actions.

The system verifier may employ a constraint solver to analyze abstract use-cases, find permissible solutions or concrete use-cases that fulfil the goals represented in the abstract use case, and ultimately generate concrete permissible (also referred to as "legal") tests, in the form of a code in a language suitable for the target to be tested ("target language").

Thus, the SoC may be tested using generated permissible tests.

In some embodiments of the present invention, the permissible tests may be presented in the form of graphs, and may consequently be generated in the form of executable files that may run to operate the SoC in accordance with the test scenario. A testing expert may take graphs representing the automatically generated tests and amend them. For example, the testing expert may amend the tests by adding or removing actions or changing the order of the actions (provided the new order is permissible too).

Thus, generating SoC tests became more efficient and less time-consuming.

However, the testing expert is still left with a tedious task of debugging. Since verification tests are carried out on an SoC, conventional debuggers may not be suited for the job, as actions on the SoC are carried out at a run-time speed, unlike device-under-test (DUT) code simulations. In these circumstances, it may not be possible to use conventional debugging tool.

There may be various kinds of bugs that occur when testing a SoC. A correctness bug may occur, for example, when an action causes an unexpected value to be returned. A performance bug may occur, for example, when an action fails to execute, or takes too long to be completed. Another example of a performance bug may be failure of a consecutive action to commence despite a successful completion of all action that are required to be completed before that action is performed.

There can be many reasons for the occurrence of performance bugs. Here are some examples:

a, an action included in the test (scenario) executed on the SoC failed to execute, because of a missing action—an action that was required to execute, in accordance with the design requirements of the SoC, before the failed action;

b, an action failed to execute, despite completion of execution of all the actions that were required to execute prior to execution of the failed action;

c, an action took much too long to execute than was anticipated;

d, an entire set of actions took much too longer to execute than was anticipated.

There are, of course other performance bugs that may occur during execution of tests on a SoC.

According to some embodiments of the present invention, a new method for debugging a SoC and a debugging system are introduced.

According to some embodiments, a system verifier may be used to generate a test code for testing the SoC.

The test code may include commands designed to invoke a plurality of actions, each of the actions to be performed on a processing component of a plurality of processing components of the SoC. The test code may also include commands for invoking printing of messages of data including start time, end time of each executed action of said plurality of actions and identity of a processing component of the plurality of processing components of the SoC, on which that action was executed.

In some embodiments of the invention the system verifier may automatically insert commands in a test code for testing the SoC for invoking printing of messages of data including start time, end time of each executed action of a plurality of actions designed to be invoked by the test code when testing the SoC, the data further including identity of a processing component of a plurality of processing components of the SoC, on which that action was executed. The commands invoking the printing of the messages may be automatically included in the test code, either when the test code is generated or later.

The data of the invoked printed messages during testing of the test code on the SoC may be recorded (e.g., by the system verifier, or by another device) and saved on a memory (volatile or non-transitory memory).

The recorded data may include the actions that were actually performed (distinct identification of each action, for example by a unique number) by the SoC when the test was executed, the recording including, for example, timing of these actions (e.g., start time, end time), data that was output, distinct identification of the processing component on which that action was executed, and any other output event. "Start time' and "end time" may also refer to "resume time" and "pause time", respectively, in the sense that the start time of the action may relate to the time when a paused action was resumed, and the end time of the action may relate to the time that action was paused. Typically, in order to send a data packet and comply with an internal-protocol, the action manager notifies the internet action controller of a packet ready to be sent and also notifies when the action has been completed, thereby the action manager initiates start-run and then waits until a notification is received that confirms that the sub-actions are completed and then resumes execution until reaching end-run. The "processing component" refers, in the context of the present invention to any component of the SoC, which is designed to process data. For example, a central processing unit (CPU), graphical processing unit (GPU), any core of a CPU or a GPU, etc. The "identification" of the processing component refers to a unique distinct identity (e.g., a unique number), so as to distinguish each processing component from the other processing components of the SoC.

According to some embodiments of the invention, the recorded data may be retrieved by logging messages for each executed action with the desired data. The messages may be generated automatically, by planting message commands in the code of the tests by the system verifier.

The recorded output may be saved in a log file or log files. The log file may be saved in any of a variety of forms (e.g., a text list, database, etc.). In some embodiments, the output of the SoC for each test is recorded and saved separately (e.g., in a separate log file). Each action is uniquely assigned (e.g., in the log) identification (ID), e.g., ID number or tag, to distinctly identify it and distinguish it from other actions (including from other occurrences of the same action). Each processing component is also uniquely assigned (e.g., in the log) identification (ID), e.g., ID number or tag, to distinctly identify it and distinguish it from other processing components of the SoC.

A system verifier (may also be referred to as "system profiler"), according to some embodiments of the present invention, may include a graphical interface which may be displayed on a display device to the testing expert.

FIG. 1 illustrates a screen 100 of a graphical user interface (GUI) of an SoC system profiler, in accordance with some embodiments of the present invention.

GUI screen 100 may include one or a plurality of frames in which data is displayed to the testing user. In some embodiments, GUI screen 100 includes frame 102 in which a graph 104, which is an abstract representation of a verification test that was run on the SoC, is presented. Graph 104 may include the various actions that formed that particular test, such as, for example "read" 106 and "write" 108. These actions appear to be actions that may be performed simultaneously, for they are located at parallel nodes of graph 104. In the present example of FIG. 1, action "read" 106 is assigned ID number 396, while action "write" 108 is assigned ID number 392 (these numbers appear on the blocks representing these actions in graph 104. The abstract representation of the test, namely graph 104, may also include status data on each action (e.g., not-started, running, blocking, ended, etc.).

GUI screen 100 further includes frame 110, in which the output log 112 (the recorded output of the executed test—the same test whose abstract graph representation 104 appears in frame 102 on SoC) is presented. In the present example, the output log 112 is in the form of a list of lines of messages corresponding to the recorded actions, each message corresponding to a single action, priority status of the message (e.g., F for "full", H for "high", M for "Medium" and L for "Low"), the timing of that action, and the message itself. Output log 112 may include implicit output information resulting from the execution of the code of the test, and explicit output information that was added by the user.

GUI screen 100 also includes frame 116, in which a graphical representation of the occurrence of each action versus time, in a waveform, is presented. The actions 118 appearing in this waveform are shown in the form of blocks whose length is determined by their performance duration, and their position on the waveform is determined by their timing. Thus, for example it is evident that action "read" 106 of graph 104 (in frame 102) is represented by block 120 in frame 116, while action "write" 108 of graph 104 is presented by block 122 in that frame. It is also evident from this GUI that actions 106 and 108 were executed substantially concurrently, as their block representations (120 and 122 respectively) appear to commence at the same time, as suggested by their aligned (one on top of the other) start positions in the waveform, whereas the "read" action ends slightly before the "write" action.

GUI screen 100 may further include additional information (e.g., memory image, relating to the memory of the SoC, and other data), that is presentable to the testing expert on a display device.

The user may select a position on the waveform (e.g., by clicking a pointing device over that location), and a corresponding location indicator 124 or 126 may be presented with information on the selected location (e.g., the timing corresponding to that location within the test execution, or other location data).

In some embodiments of the present invention, the user may select a line of the output log 112, for example by clicking on that line 114, thereby causing that line to appear highlighted. The system verifier may be designed to react to such selection of the line of the output log, by highlighting (or otherwise indicating) the selected action in the abstract graph 104, and/or by highlighting the block on the waveform presented in frame 116 that corresponds to the selected action. This allows a testing expert to quickly and easily track and trace actions and their resulting output as appearing on the GUI screen 100.

The waveform feature of the SoC system verifier, according to some embodiments of the present invention, allows the testing expert to immediately spot irregularities or abnormalities in the execution of the SoC test. For example, the testing expert may spot on the waveform a certain action that was supposed to be performed over a short period of time but lasted longer (or too much linger). The testing expert may identify actions that where not supposed to be performed at the timing of their actual performance, or were not supposed to be performed at all. Thus, the testing expert is provided with a graphical visualization of the executed test and its results, presenting go-to-cause debug information, making it simpler for the testing expert to find bugs and identify their causes.

FIG. 2 illustrates another screen 200 of a graphical user interface (GUI) of an SoC system verifier, in accordance with some embodiments of the present invention. In screen 200, frame 202 may present the script code of the verification test, whose abstract graph representation 104 is also presented in that screen.

According to some embodiments of the present invention, the testing expert may select a line 113 in the output log 112 presented in frame 110, highlighting that line. Consequently, action 105 in graph 104, which correlates to the selected line (the action in that line and the highlighted action in graph 104 correspond—it is the same action) is also highlighted, and so is the corresponding line 206 in the script code 204, presented in frame 202.

Figure 3:
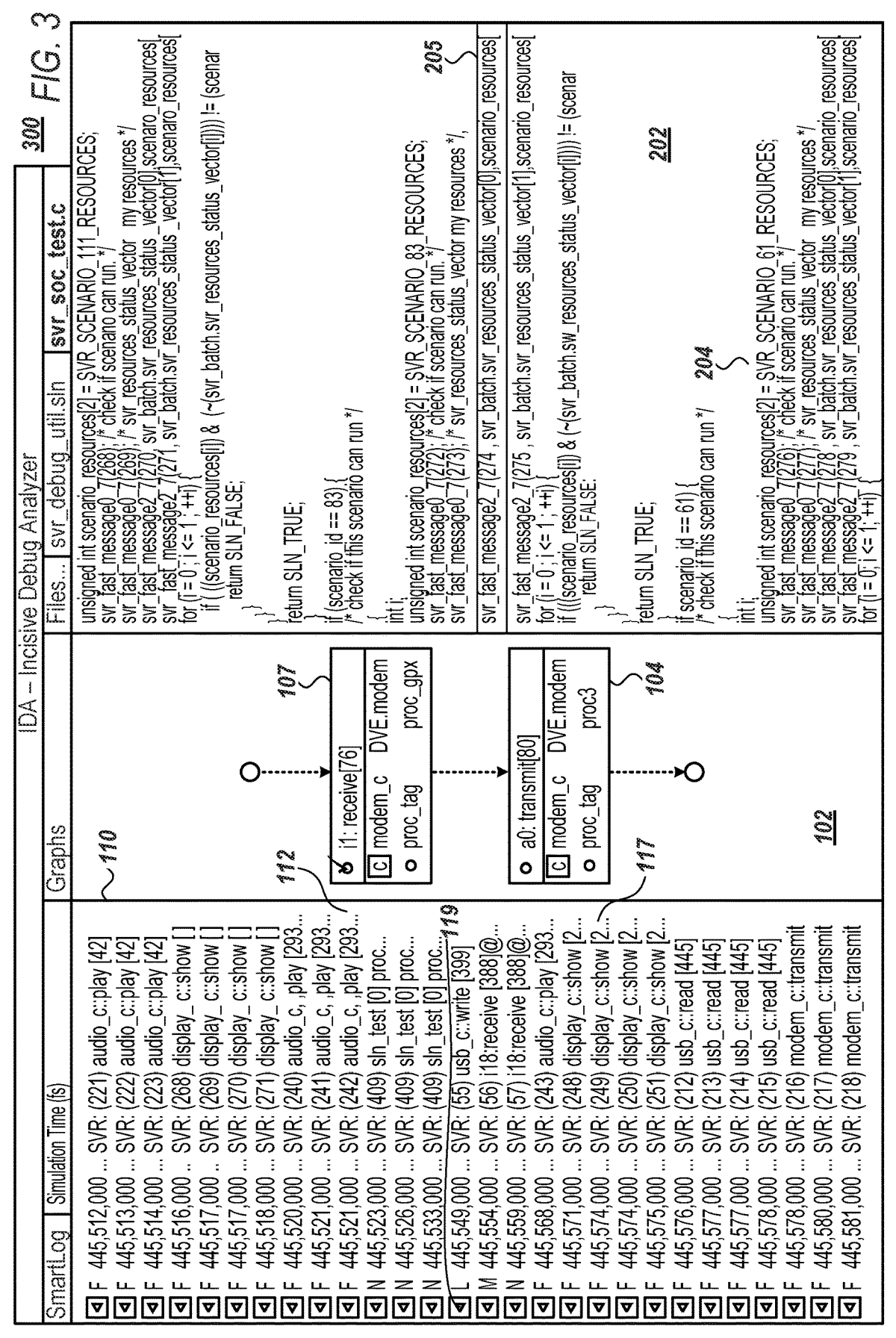

FIG. 3 illustrates another screen 300 of a graphical user interface (GUI) of an SoC system verifier, in accordance with some embodiments of the present invention. Upon selection of action "receive [76]" 107, all messages that relate to that action appear highlighted 117 in frame 110 where the output log 112 is presented. The testing expert may wish to review the code line which invoked a particular message (and action), so by clicking on one of the small triangles 119 a view of some or all of the test code 204 is presented in frame 202, with the code line that invoked the message and corresponding action highlighted 205.

Figure 4:
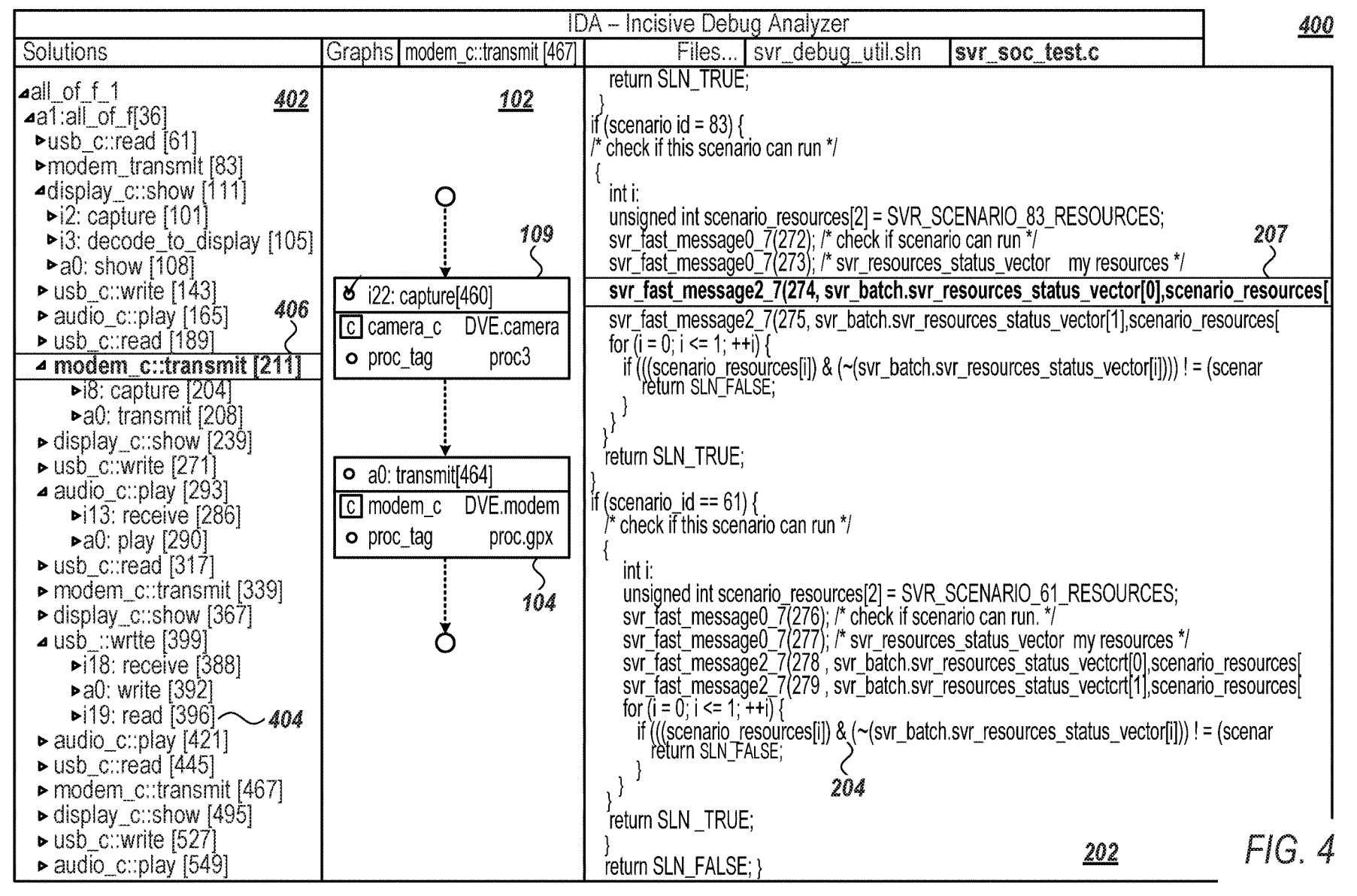

FIG. 4 illustrates yet another screen of a graphical user interface (GUI) of an SoC system verifier, in accordance with some embodiments of the present invention. Often the sheer size of the abstract graph makes it practically impossible to be presented in a graphical form. Thus, the abstract graph may be presented in a text form. In screen 400, a new frame 402 is presented which includes a text form 404 of the abstract graph. When a certain line 406 that includes an action in the text form 404 of the abstract graph is selected, a portion 104 of the graphical representation of that graph that includes the selected action 109, with the selected action highlighted. As the system verifier can link between specific actions in the test code and in the output log (one method to obtain this linkage is detailed below) the corresponding line 207 in the test code 204 is highlighted.

The linking of the various representations on the same action in the code script, in the output log and on the waveform may easily be performed. One simple way of doing that is described hereinafter:

In the generation of the test code, the generator of the code plants messages (e.g., remarks) in the generated test code, assigning the start and end of each action with a unique ID (e.g., number). All starts and ends of actions are identified by a distinctly unique ID (e.g., the start of action a1 is assigned ID number 1, the end of action a1 is assigned ID number 2, the start of action a2 is assigned ID number 3, the end of action a2 is assigned ID number 4, and so on).

A reference file, in which all starts and ends of all actions in the test are saved with their corresponding IDs, is provided.

When the test is executed, the messages appear in the output log, allowing identification of the start and end of each action performed during the test, and association of these start and end of each action with the start and end of actions in the output log. The graphical waveform representation may be generated based on this identification and association, and the links between the various representations of each action may be established.

A SoC may include a plurality of processing components, such as, for example, one or more central processing units (CPUs), each including one or a plurality of cores, etc. Some actions may be performed only on a particular component or particular components, whereas other actions may be performed on different component or components. In some cases one or some of the components of the SoC may be more heavily used than other component, for various reasons.

Referring back to FIG. 1, action 106 ("read") and action 108 ("write') may be performed on different components of the SoC. For example, action 106 may be performed on one core, while action 108 may be performed on another core. In another example, action 106 may be performed on one CPU, while action 108 may be performed on another CPU. The next action may require that both action 106 and action 108 be executed before that action is performed.

Figure 5A:
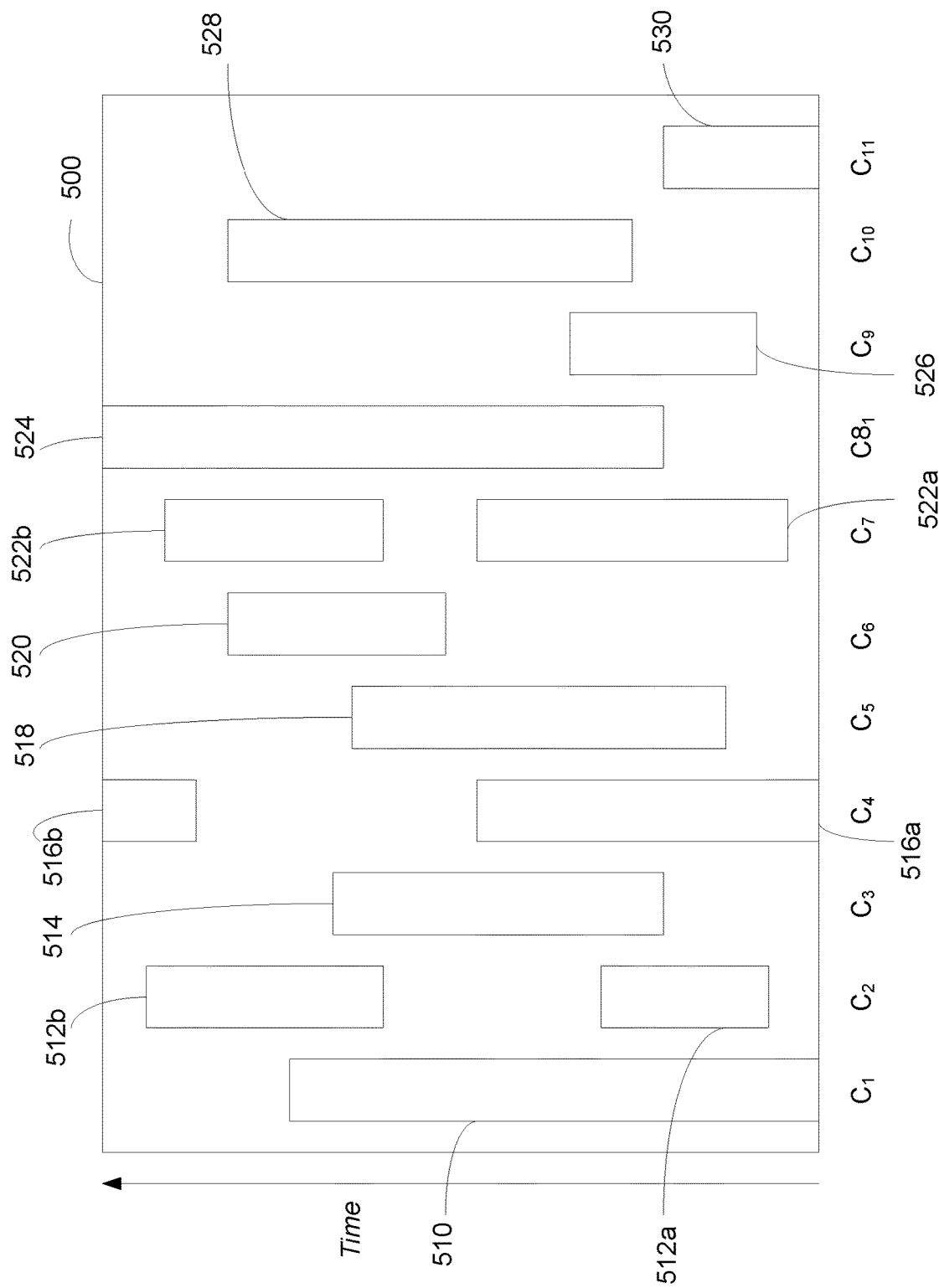
FIG. 5A illustrates a frame of a graphical user interface (GUI) of an SoC system profiler, presenting usage of processing components of the SoC over time, in accordance with some embodiments of the present invention.

FIG. 5A illustrates a frame 500 of a graphical user interface (GUI) of an SoC system profiler, presenting usage of processing components of the SoC over time, in accordance with some embodiments of the present invention.

Frame 500 displays the activity of processing components $C_1$-$C_{11}$ of a SoC. For example, $C_1$-$C_4$ may be four cores of a first CPU. $C_5$-$C_8$ may be four cores of a second CPU, and $C_9$-$C_{11}$ may be three cores of a GPU. The vertical axis represents time (e.g., units of milliseconds, femtoseconds, nanoseconds, etc.). The activity of the processing components is represented by blocks, whose ends correspond to the start time and end time of continued activity of that component. In the example of FIG. 5A, the activity of processing component $C_1$ is represented by block 510, the activity of processing component $C_2$ is represented by blocks 512a and 512b (due to an interrupt in the activity time of that component), the activity of processing component $C_3$ is represented by block 514, and so on (blocks 516a. 516b, 518, 520, 522a, 522b, 524, 526, 528 and 530 representing the activities of processing components $C_4$-$C_{11}$, respectively).

This graphical presentation may be built based on knowing that while an action may be performed on one or more processing components of a system, once an instance of an action is initiated, it is executed from start to end on a single processing component, and on knowing the start time and end time for action, pause and resume times of an action (if its processing by the processing component was paused, for example, when swapping in and out with another action, or when waiting for a required condition to occur) and the identity of the processing component of which that action was performed and accumulating the activity times of each processing components of the system. This information is presented in form of a graphical presentation showing blocks of time during which each processing component was active. Furthermore, an action may be processed in several active spells on a processing component, in which case the start time and end time for each spell may be recorded, so that a full picture of the activity of processing components of the SoC may be obtained.

It is evident from the graphical representation that $C_1$, for example, was active for a period of time during which $C_2$ was idle at first, then active for a shorter period, idle again and active for the remaining time and even some time after $C_1$ ended its activity and became idle. C3 was idle at first, then became active, while $C_2$ was already active too, and ended its activity before $C_1$ ended its activity, and while $C_2$ was in its second period of activity, and so on. Given that the debug expert knows what is expected form the SoC, knows which actions were included in the test that was executed on the SoC, a graphical presentation of the activity of the processing components of the SoC is a useful tool that may aid the debug expert in identifying faults and bugs.

Figure 5B:
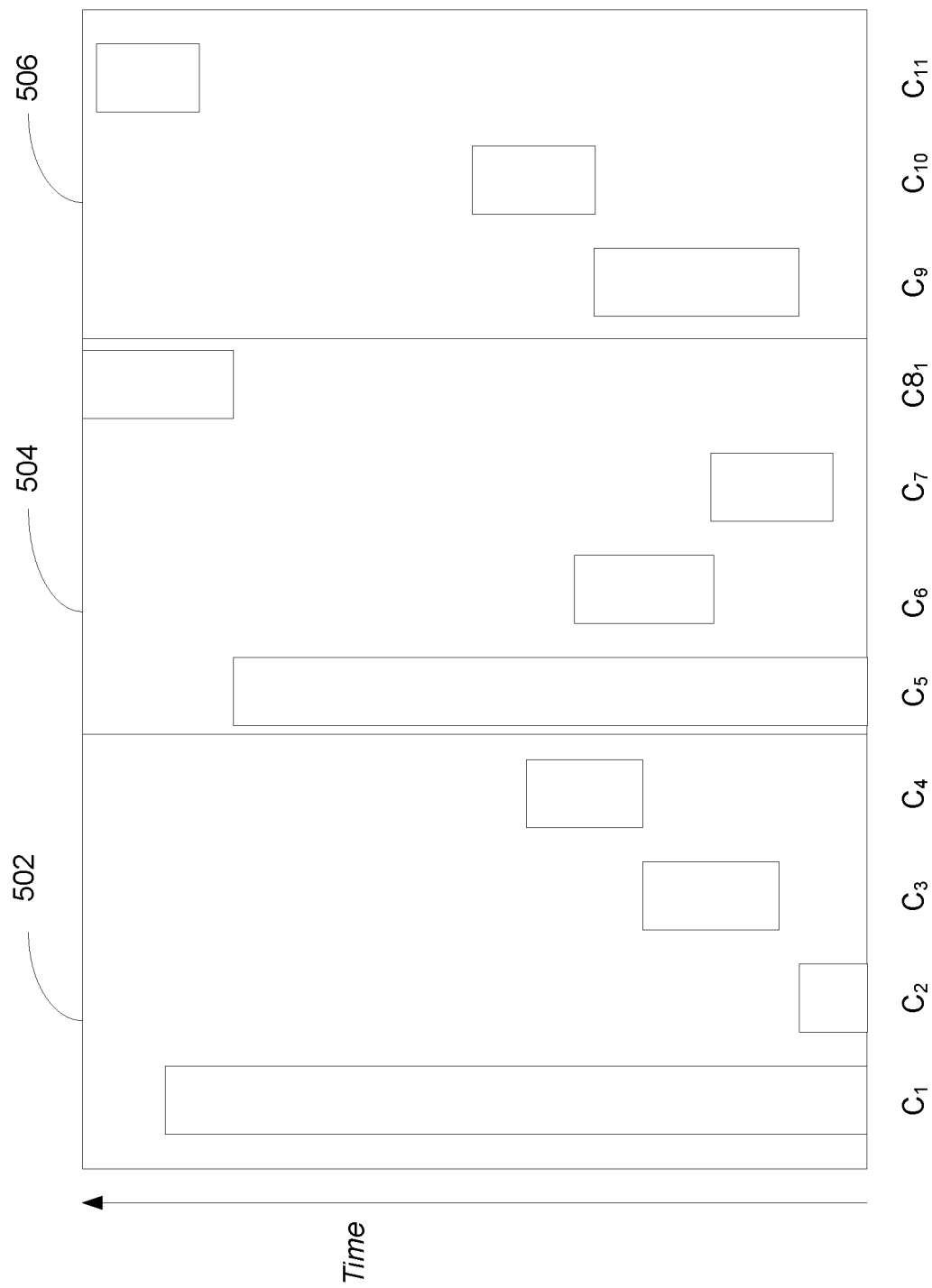
FIG. 5B illustrates detection of three suspected bugs using a graphical user interface (GUI) of an SoC system profiler, presenting usage of processing components of the SoC over time, in accordance with some embodiments of the present invention.

FIG. 5B illustrates detection of three suspected bugs using a graphical user interface (GUI) of an SoC system profiler, presenting usage of processing components of the SoC over time, in accordance with some embodiments of the present invention.

In the left hand side frame 502, the activity of processing components $C_1$-$C_4$ is displayed. It is evident that processing component $C_1$ was active much longer then processing components $C_2$-$C_4$, whereas processing components $C_2$-$C_4$ where active for substantially shorter successive periods of time. This may lead the debug expert to want to further investigate the behavior of $C_1$ and the action or actions that were executed on it.

In the central frame 504, processing components $C_5$-$C_7$ were concurrently active, but $C_5$ was active much longer than the other processing components, and only when processing component $C_5$ ended its activity did processing component $C_8$ commence its activity. The debug expert may find it interesting to investigate what action or actions were performed by processing component $C_5$, and also determine whether the action performed by $C_5$ were required by the action or actions performed on $C_8$ to be executed.

In the right hand side frame 506, processing components $C_9$ and $C_{10}$ performed actions and processing component $C_{11}$ followed, but after a substantially long period of inactivity. This may lead the debug expert to investigate the reason for this pause. A reason for such a pause may be a missing action that was required by the design of the SoC to allow the next action to be executed. In order to amend this a test may be generated that includes the missing action.

According to some embodiments of the present invention, a user of the system verifier may select a specific period of activity of one of the processing components of the SoC, for example by clicking on the block presenting the desired active time of a that processing component (e.g., block 510 relating to processing component $C_1$, see FIG. 5A), or otherwise select a desired processing component. Upon such selection a graphical presentation of the actions performed by that processing component during the period of time of activity may be presented, via the user interface, to the user.

Figure 5C:
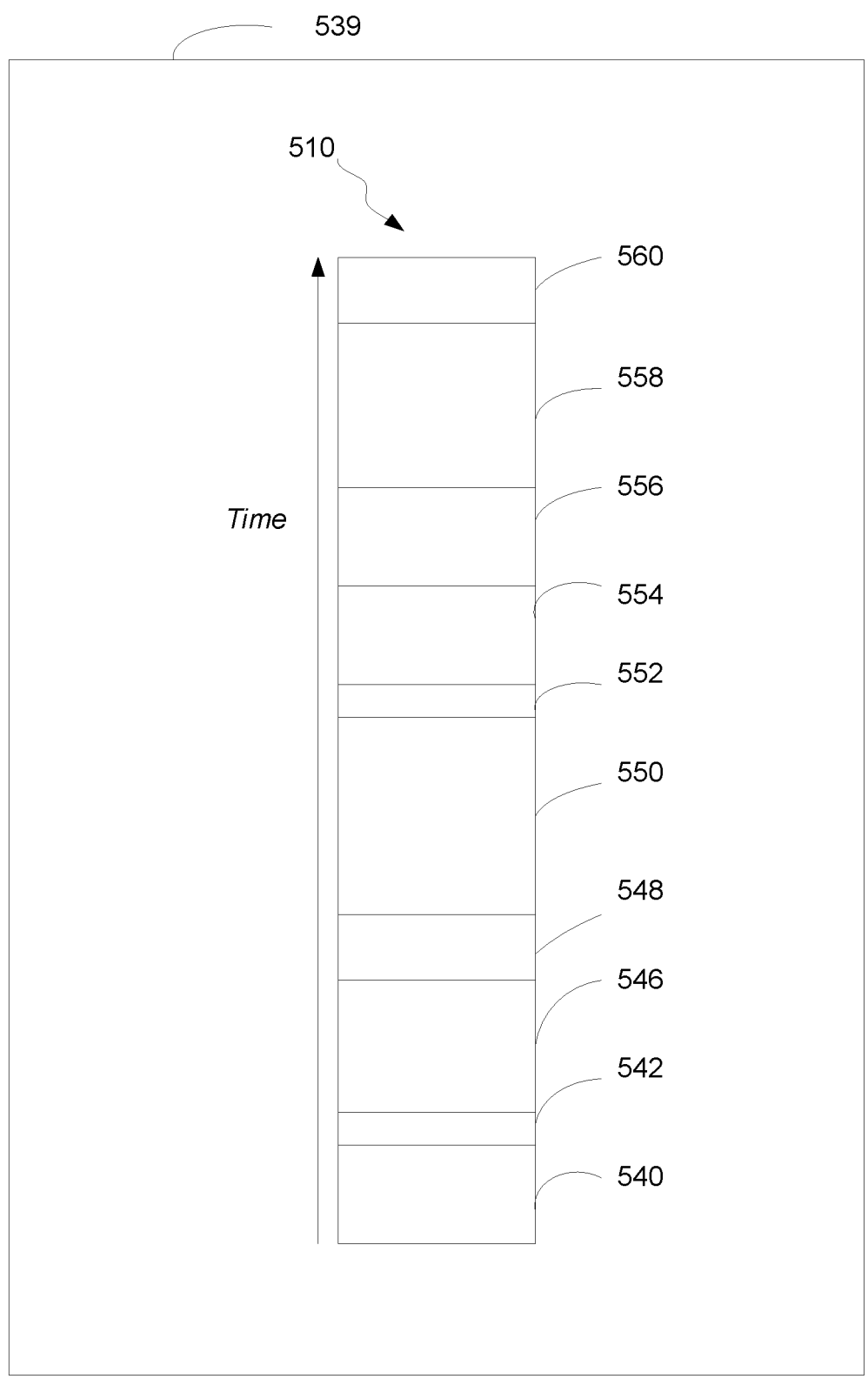
FIG. 5C illustrates a representation of actions performed by a processing component during a selected period of activity, according to some embodiments of the present invention.

FIG. 5C illustrates a representation of actions performed by a processing component during a selected period of activity, according to some embodiments of the present invention.

Frame 539 may be presented, via the user interface, displaying the selected activity block of a particular processing components (in this example, block 510 of processing component $C_1$, shown in FIG. 5A). The displayed block 510, may be divided into sub-blocks—540, 542, 544, 546, 548, 550, 552, 554, 556, 558 and 560 in the illustrated example—each sub-block representing a single action of the actions that were performed on that particular processing component in the selected activity block of time, and whose dimensions—in this example their lengths—correspond to their time duration (the time it took each action to perform in that activity block). A time axis may be provided, adjacent to the presented block, to help the user in determining the actual duration of time it took for each action to be performed during the selected activity period of the processing component. Information pertaining to each action, for example, an identification of that action may be presented on or adjacent each sub-block, or caused to be presented when selecting a particular sub-block, such as, for example, by clicking on that sub-block, by passing a cursor over that sub-block, or otherwise selecting the sub-block.

In some embodiments a single action may be represented by two or more sub-blocks. This is so when an action is performed in separate sessions by a processing component, for example, when performing several actions whose performance is shared on the same processing component (swapping in and out) or when an action is paused, waiting until a required condition is met.

Thus, for example, in the representation of the activity block of FIG. 5C, a single action may have been divided into three separate time slots, represented by sub-blocks 542, 548 and 554.

According to some embodiments of the present invention, the user may select, on a presentation of an activity block that displays sub-blocks pertaining to the actions performed on the processing component during the activity time of the selected block, a specific action by clicking or otherwise selecting that action and that action—that is the sub-block or sub-blocks pertaining to the time period or periods during which that action was performed—will be presented uniquely, for example, on a separate frame.

Figure 5D:
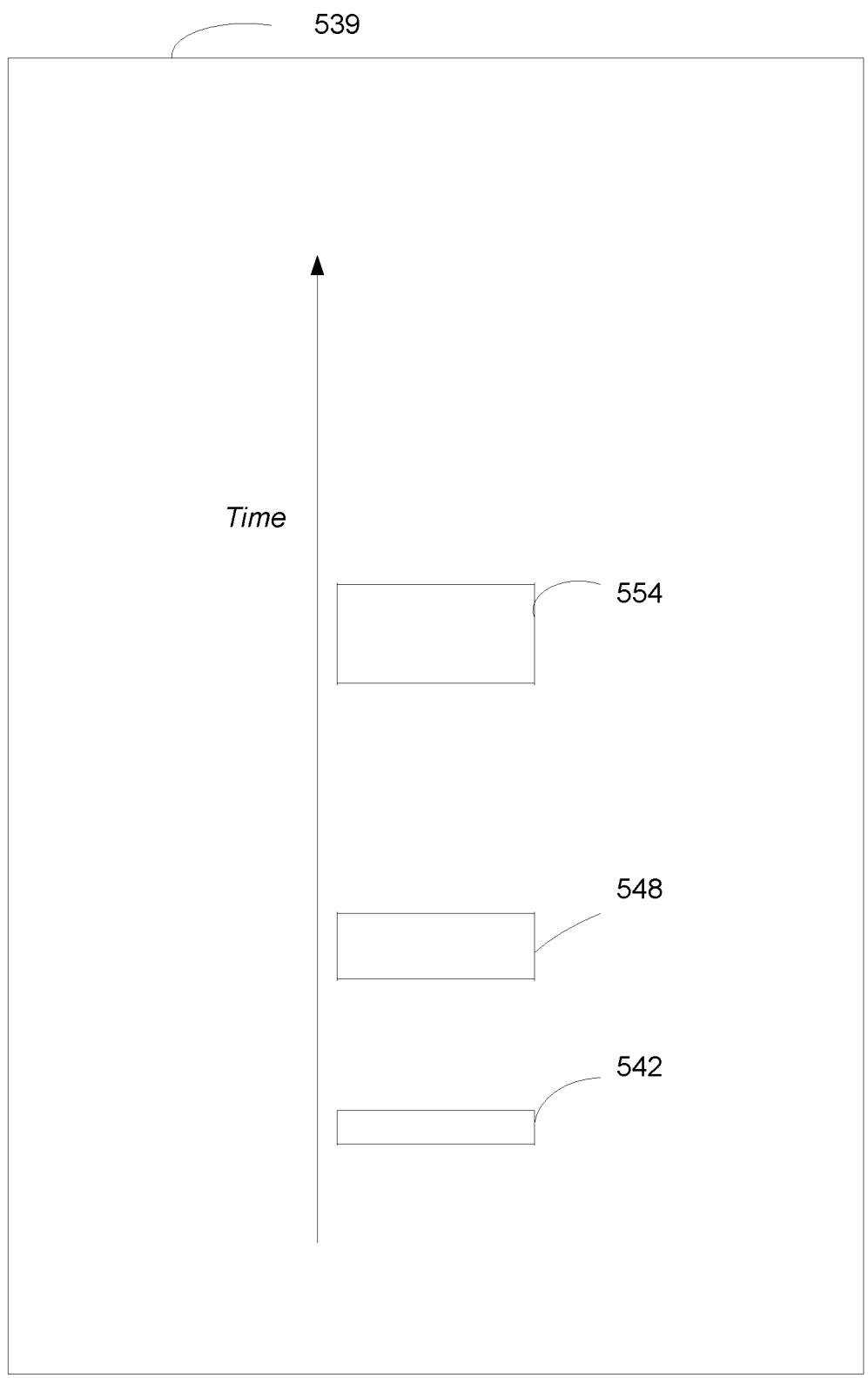
FIG. 5D illustrates a representation of a selected action performed by a processing component, according to some embodiments of the present invention.

FIG. 5D illustrates a representation of a selected action performed by a processing component, according to some embodiments of the present invention. Shown are just the sub-blocks that pertain to that particular action, that is—the sub-blocks representing the time period or periods during which that action was performed on the processing component.

The graphical arrangements of the various representations described hereinabove and shown in the appended figures are given as examples. Other graphical presentations and arrangements may be chosen.

Figure 6:
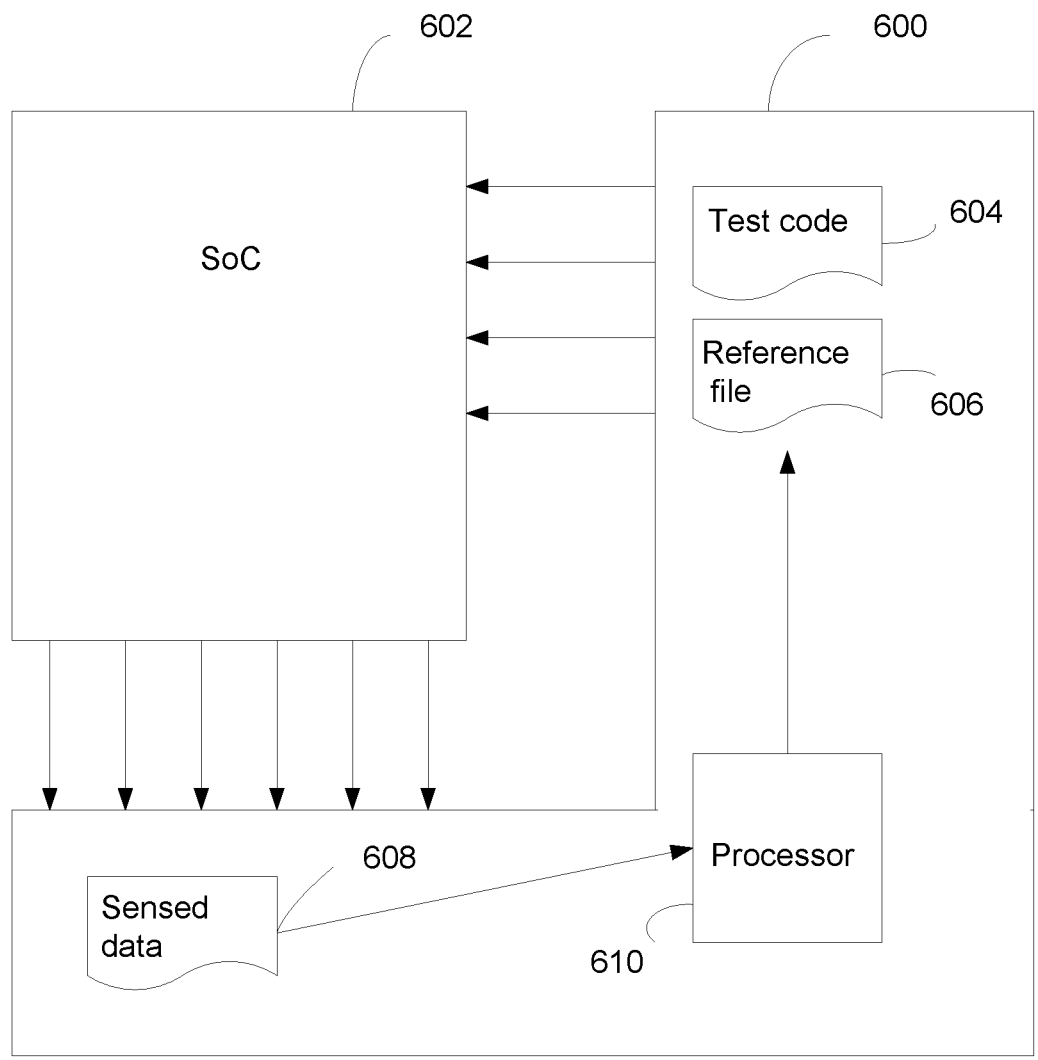
FIG. 6 illustrates a system for verification testing of a SoC, according to some embodiments of the present invention.

FIG. 6 illustrates a system 600 for verification testing of a SoC 602, according to some embodiments of the present invention. System 600 may include a processor 610 that is configured to execute a test code 604 by injecting data (which may include commands and information) into SoC 602. A reference file 606 is saved for accessing by processor 610 in order to link between the actions of SoC 602 invoked by test code 604 and the output data relating to the performed actions and the processing components of the SoC that executed these actions.

The operation of SoC generates during the test is sensed, and the sensed data 608 recorded and provided to processor 610, where the received data is processed and links between the invoked actions by the test code and the actual actions performed during the test are established, and processing components of the SoC that were active and on which the actions were executed.

Figure 7:
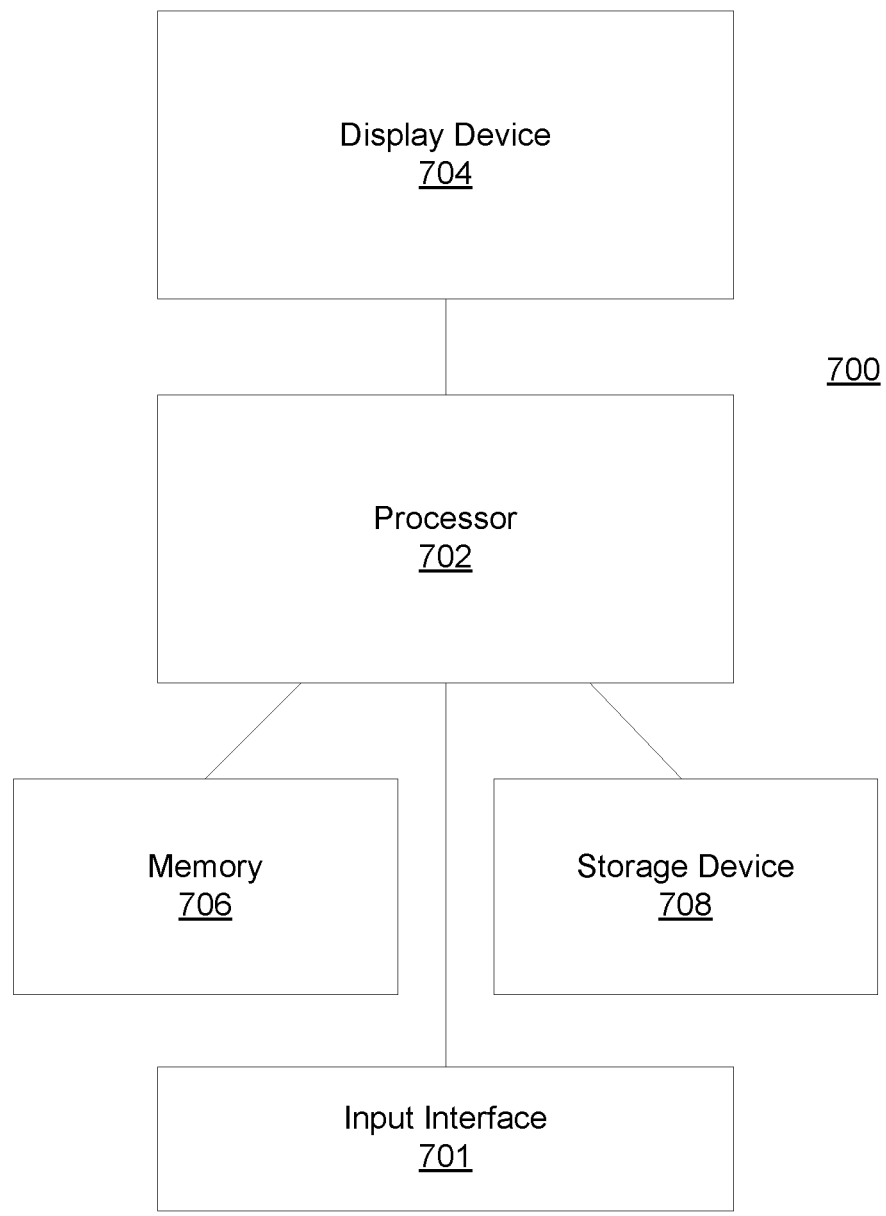
FIG. 7 illustrates a system verifier for debugging a SoC under test, according to some embodiments of the present invention.

FIG. 7 illustrates a system verifier system 700 for debugging a SoC under test, according to some embodiments of the present invention.

System 700 may include a processing unit 702 (e.g., one or a plurality of processors, on a single machine or distributed on a plurality of machines) for executing a method according to some embodiments of the present invention.

System 700 may include an input interface 701 for receiving data and instructions from a user, such as, for example, one or a plurality of keyboards, pointing devices, touch sensitive surfaces (e.g. touch sensitive screens), etc. for allowing a user to input commands and data. Processing unit 702 may be linked with memory 706 on which a program implementing a method according to some embodiments of the present invention and corresponding data may be loaded and run from and data may be saved, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g., display device such as CRT, LCD, LED, etc.) on which one or a plurality user interfaces associated with a program implementing a method according to some embodiments and corresponding data may be presented.

In some embodiments of the present invention, system 600 and system 700 may be unified. In some other embodiments, these systems may be separate.

Figure 8:
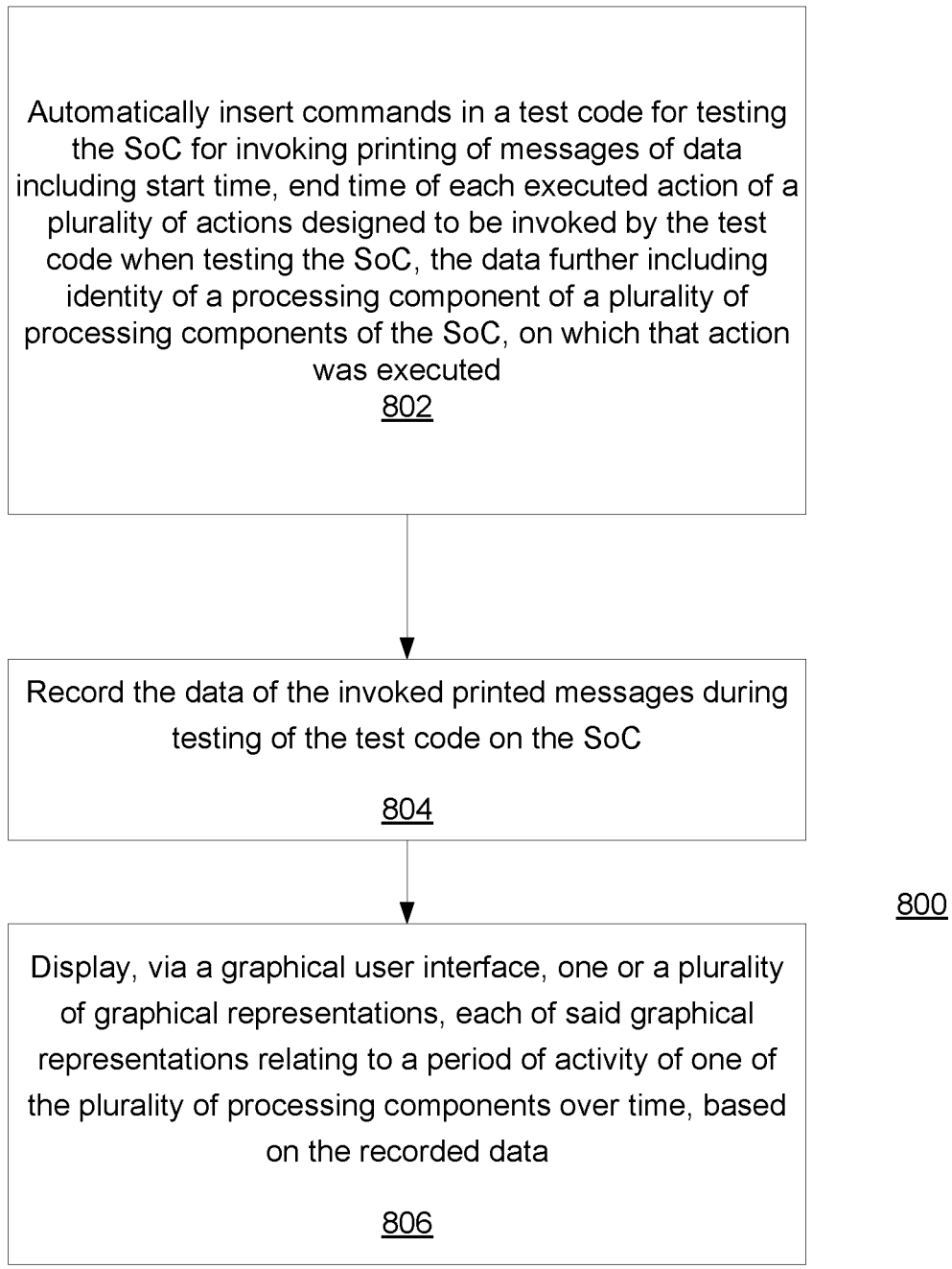
FIG. 8 illustrates a method for debugging a SoC under test, according to some embodiments of the present invention.

FIG. 8 illustrates a method for debugging a SoC under test, according to some embodiments of the present invention. Method 800 may include automatically inserting commands in a test code for testing the SoC for invoking printing of messages of data including start time, end time of each executed action of a plurality of actions designed to be invoked by the test code when testing the SoC, the data further including identity of a processing component of a plurality of processing components of the SoC, on which that action was executed.

In some embodiments the method may also include recording 804 the data of the invoked printed messages during testing of the test code on the SoC. The method may also include displaying 806, via a graphical user interface, one or a plurality of graphical representations, each of said graphical representations relating to a period of activity of one of the plurality of processing components over time, based on the recorded data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and be executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for debugging a system on chip (SoC) under test, the method comprising:
    automatically generating a test code for testing the SoC, the test code comprising commands designed to invoke a user-provided list of a plurality of actions that the SoC may perform and constraints relating to a permissible order of the actions in the list;
    automatically inserting additional commands in the test code for invoking printing of messages of data into a log file, each message of the messages including a start time and end time of each executed action of the plurality of actions, the executed action to be invoked by the test code when testing the SoC, the data further including identity of a processing component of a plurality of processing components of the SoC on which the executed action was executed, each of the processing components comprising a central processing unit (CPU) or a graphical processing unit (GPU);
    recording the data of the invoked printed messages in the log file during testing of the test code on the SoC; and
    displaying, via a graphical user interface, one or a plurality of graphical representations, each of said graphical representations presenting usage of at least one of the plurality of processing components over time, based on the recorded data.

2. The method of claim 1, further comprising, receiving from a user a selection of a graphical representation of said one or a plurality of graphical presentations, and displaying via the graphical user all actions of said plurality of actions that were executed during the period of activity of the one processing component.

3. The method of claim 2, wherein said all actions are displayed using representations of time slots, each of the time slots representing a time duration during which each of said all actions was executed.

4. The method of claim 2, wherein the time slots are represented by sub-blocks.

5. The method of claim 2, further comprising receiving from the user a selection of an action of said all actions, and displaying via the graphical user interface only that action.

6. The method of claim 5, wherein that action is displayed using one or more representations of time slots, each of the time slots representing a time duration during which that action was executed.

7. A system for debugging a system on chip (SoC) under test, the system comprising:
    a memory; and a processor, the processor configured to:
    automatically generate a test code for testing the SoC, the test code comprising commands designed to invoke a user-provided list of a plurality of actions that the SoC may perform and constraints relating to a permissible order of the actions in the list;
    automatically insert additional commands in the test code for invoking printing of messages of data into a log file, each message including a start time and end time of each executed action of the plurality of actions designed to be invoked by the test code when testing the SoC, the data further including identity of a processing component of a plurality of processing components of the SoC on which that executed action was executed, each of the processing components comprising a central processing unit (CPU) or a graphical processing unit (GPU);
    record the data of the invoked printed messages in the log file during testing of the test code on the SoC; and
    display, via a graphical user interface, one or a plurality of graphical representations, each of said graphical representations presenting usage of at least one of the plurality of processing components over time, based on the recorded data.

8. The system of claim 7, wherein the processor if further configured to receive from a user a selection of a graphical representation of said one or a plurality of graphical presentations, and display via the graphical user all actions of said plurality of actions that were executed during the period of activity of the one processing component.

9. The system of claim 8 wherein the processor is configured to display said all actions using representations of time slots, each of the time slots representing a time duration during which each of said all actions was executed.

10. The system of claim 8, wherein the time slots are represented by sub-blocks.

11. The system of claim 8, wherein the processor is further configured to receive from the user a selection of an action of said all actions, and display via the graphical user interface only that action.

12. A non-transitory computer readable storage medium for debugging a system on chip (SoC) under test, having stored thereon instructions that when executed by a processor will cause the processor to:
    automatically generating a test code for testing the SoC, the test code comprising commands designed to invoke a user-provided list of a plurality of actions that the SoC may perform and constraints relating to a permissible order of the actions in the list;
    automatically insert additional commands in the test code for invoking printing of messages of data into a log file, each message including a start time and end time of each executed action of the plurality of actions designed to be invoked by the test code when testing the SoC, the data further including identity of a processing component of a plurality of processing components of the SoC, on which that executed action was executed, each of the processing components comprising a central processing unit (CPU) or a graphical processing unit (GPU);
    record the data of the invoked printed messages in the log file during testing of the test code on the SoC; and
    display, via a graphical user interface, one or a plurality of graphical representations, each of said graphical representations presenting usage of at least one of the plurality of processing components over time, based on the recorded data.

13. The non-transitory computer readable storage medium of claim 12, having stored thereon instructions that when executed by a processor will further cause the processor to receive from a user a selection of a graphical representation of said one or a plurality of graphical presentations, and display via the graphical user all actions of said plurality of actions that were executed during the period of activity of the one processing component.

14. The non-transitory computer readable storage medium of claim 13, having stored thereon instructions that when executed by a processor will further cause the processor to display said all actions using representations of time slots, each of the time slots representing a time duration during which each of said all actions was executed.

15. The non-transitory computer readable storage medium of claim 14, having stored thereon instructions that when executed by a processor will further cause the processor to receive from the user a selection of an action of said all actions, and display via the graphical user interface only that action.

\* \* \* \* \*